(12) United States Patent
Wirth

(10) Patent No.: US 7,838,892 B2
(45) Date of Patent: Nov. 23, 2010

(54) OPTOELECTRONIC SEMICONDUCTOR CHIP AND METHOD FOR FORMING A CONTACT STRUCTURE FOR MAKING ELECTRICAL CONTACT WITH AN OPTOELECTRONIC SEMICONDUCTOR CHIP

(75) Inventor: Ralph Wirth, Pettendorf-Adlersberg (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 44 days.

(21) Appl. No.: 11/118,149

(22) Filed: Apr. 29, 2005

(65) Prior Publication Data
US 2005/0253155 A1    Nov. 17, 2005

(30) Foreign Application Priority Data
Apr. 29, 2004  (DE) .................. 10 2004 021 150
May 26, 2004  (DE) .................. 10 2004 025 684

(51) Int. Cl.
*H01L 29/207* (2006.01)

(52) U.S. Cl. ............................ 257/91; 257/93; 257/594; 257/E33.062

(58) Field of Classification Search ............... 257/88, 257/91, 93, 594, E33.062
See application file for complete search history.

(56) References Cited

U.S. PATENT DOCUMENTS

| 3,903,590 | A |   | 9/1975  | Yokogawa |
| 4,783,695 | A |   | 11/1988 | Eichelberger et al. |
| 4,918,811 | A |   | 4/1990  | Eichelberger et al. |
| 4,957,776 | A |   | 9/1990  | Higuchi et al. |
| 5,062,115 | A | * | 10/1991 | Thornton ............... 372/50.122 |
| 5,138,433 | A |   | 8/1992  | Hiruta |
| 5,231,751 | A |   | 8/1993  | Sachdev et al. |
| 5,241,456 | A |   | 8/1993  | Marcinkiewicz et al. |
| 5,262,658 | A | * | 11/1993 | Jankowski .................... 257/88 |
| 5,373,174 | A |   | 12/1994 | Yamamoto |
| 5,373,627 | A |   | 12/1994 | Grebe |
| 5,434,751 | A |   | 7/1995  | Cole et al. |
| 5,453,386 | A | * | 9/1995  | Holm et al. ................ 438/34 |

(Continued)

FOREIGN PATENT DOCUMENTS

DE    2810005    3/1978

(Continued)

OTHER PUBLICATIONS

I. Schnitzer et al., "30% external quantum efficiency from surface textured, thin-film light-emitting diodes", Appl. Phys. Lett. vol. 63, No. 16, pp. 2174-2176, Oct. 18, 1993.

(Continued)

*Primary Examiner*—Wael M Fahmy
*Assistant Examiner*—John C Ingham
(74) *Attorney, Agent, or Firm*—Cohen Pontani Lieberman & Pavane LLP

(57) ABSTRACT

An optoelectronic semiconductor chip, comprising a plurality of semiconductor function regions (10) arranged on a common carrier layer (1, 7), at least one of the semiconductor function regions being a defect region (12), and a contact structure (18) for making electrical contact with the optoelectronic semiconductor chip. The contact structure is electrically conductively connected to at least one of the semiconductor function regions, and the contact structure is adapted to be electrically separated, or it is electrically separated, from the defect region.

14 Claims, 3 Drawing Sheets

U.S. PATENT DOCUMENTS

| | | | |
|---|---|---|---|
| 5,554,996 A | 9/1996 | Chatzipetros | |
| 5,612,254 A | 3/1997 | Mu et al. | |
| 5,627,931 A | 5/1997 | Ackley et al. | |
| 5,725,787 A | 3/1998 | Curtin et al. | |
| 5,919,569 A | 7/1999 | Obiya et al. | |
| 6,044,046 A | 3/2000 | Diezmann et al. | |
| 6,091,332 A | 7/2000 | Eberhardt et al. | |
| 6,211,572 B1 | 4/2001 | Fjelstad et al. | |
| 6,403,476 B2 | 6/2002 | Murayama et al. | |
| 6,468,638 B2 | 10/2002 | Jacobsen et al. | |
| 6,630,366 B2 * | 10/2003 | Taniguchi et al. | 438/34 |
| 6,653,163 B2 * | 11/2003 | Van Hoof et al. | 438/47 |
| 6,784,458 B1 * | 8/2004 | Wang et al. | 257/79 |
| 6,791,114 B2 * | 9/2004 | Shen | 257/79 |
| 2002/0036471 A1 * | 3/2002 | Silvestre | 315/160 |
| 2002/0093396 A1 | 7/2002 | Smith et al. | |
| 2003/0112192 A1 | 6/2003 | King et al. | |
| 2005/0093678 A1 | 5/2005 | Forster et al. | |

FOREIGN PATENT DOCUMENTS

| | | |
|---|---|---|
| DE | 2810054 | 9/1978 |
| EP | 0277606 | 8/1988 |
| EP | 0277606 A2 | 8/1988 |
| EP | 0450950 | 10/1991 |
| EP | 0498703 | 8/1992 |
| EP | 1111537 A2 | 6/2001 |
| EP | 1302893 A1 | 4/2003 |
| EP | 1302893 | 4/2006 |
| GB | 2 381 381 A | 4/2003 |
| JP | 8-137413 | 5/1996 |
| WO | WO 8802549 | 4/1988 |
| WO | WO 00/16493 | 3/2000 |
| WO | WO 00/23994 A | 4/2000 |
| WO | WO 0162517 | 8/2001 |
| WO | WO 2004/006259 | 1/2004 |
| WO | WO2004/005494 | 3/2004 |

OTHER PUBLICATIONS

Search Report issued for Taiwanese Patent Application No. 094113699.

PCT international Written Opinion, PCT Application No. PCT US02/16474. Mailed Oct. 2002.

PCT international Search Report, PCT Application No. PCT US2005/002534. Mailed Nov. 11, 2005.

IPRP Chapter 1, PCT Application No. PCT/US2004/009070, (7 pages) mailed Oct. 13, 2005.

PCT international Written Opinion, PCT Application No. PCT US03/02115. (4 pages).

PCT Notification of Transmittal of International Preliminary Examination report for PCT Application No. PCT US02/16474. Mailed Jul. 21, 2005 (5 pages).

PCT Written Opinion Report, PCT Application No. PCT US2005/002534. Mailed Nov. 11, 2005 (7 pages).

PCT Notification of Transmittal of International Search Report and The Written Opinion of the International Searching Authority, or the Declaration for PCT/US2005/040772, mailed on Jul. 26, 2006 (15 pages).

Kriebel, Frank (2005). RFID Chip and Tag Assembly Challenges: Low Cost RFID IC Packaging and Assembly Workshop, Nov. 14, 2005, Munich, Germany. (12 pgs).

IPRP Chapter 1, PCT Application No. PCT/US2005/002534, (9 pages) mailed Aug. 10, 2006.

PCT Notification of Transmittal of International Search Report and The Written Opinion of the International Searching Authority for PCT/US2004/09070, mailed on Feb. 10, 2005 (12 pages).

* cited by examiner

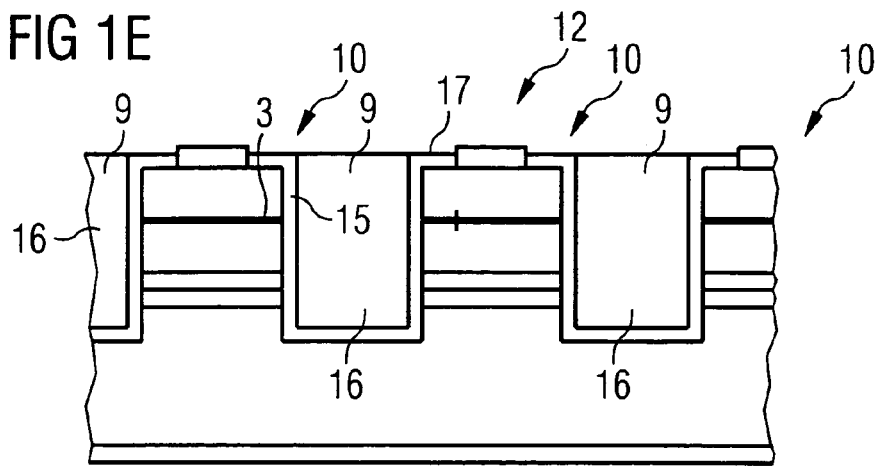
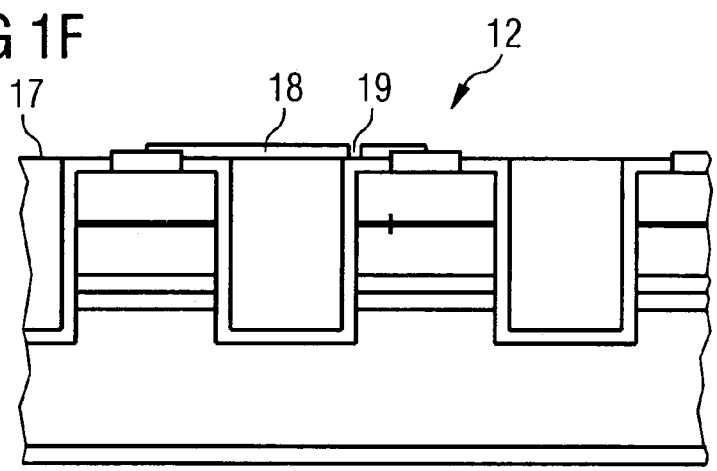
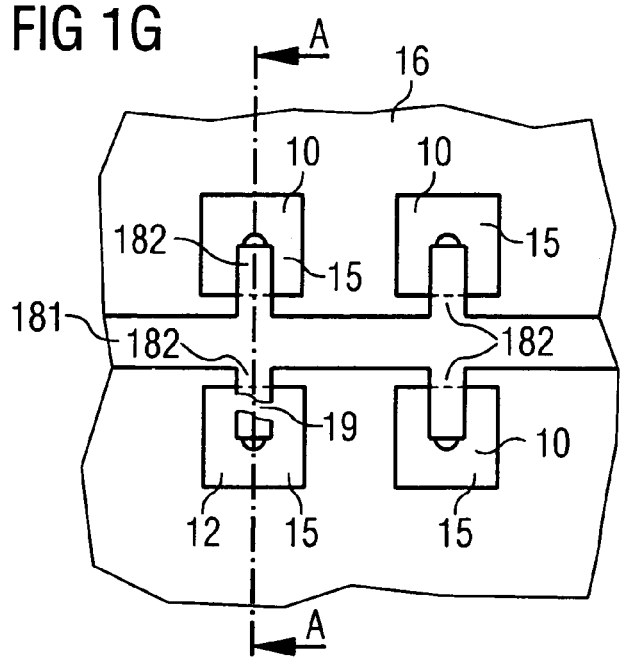

OPTOELECTRONIC SEMICONDUCTOR CHIP AND METHOD FOR FORMING A CONTACT STRUCTURE FOR MAKING ELECTRICAL CONTACT WITH AN OPTOELECTRONIC SEMICONDUCTOR CHIP

RELATED APPLICATIONS

This patent application claims the priority of German patent application nos. 10 2004 021 150.7 and 10 2004 025 684.5 dated Apr. 29, 2004 and May 26, 2004, respectively, the disclosure content of which is hereby incorporated by reference.

FIELD OF THE INVENTION

The present invention relates to an optoelectronic semiconductor chip having a plurality of semiconductor function regions arranged on a carrier layer, and a contact structure for making electrical contact with the optoelectronic semiconductor chip. Furthermore, the invention relates to a method for forming a contact structure for making electrical contact with an optoelectronic semiconductor chip having a plurality of semiconductor function regions arranged on a carrier layer. The semiconductor chip is preferably formed as an LED chip.

BACKGROUND OF THE INVENTION

In the case of LED chips, a highest possible total luminous flux of the light generated by the LED chip is often desirable.

The total luminous flux generated can be increased by increasing the operating current of the LED chip. However, this increases the risk of a failure of the LED chip on account of current-dictated degradation, i.e. a damage to the semiconductor material as a result of the operating current being increased. Furthermore, the heat loss produced usually rises with the operating current, and has to be dissipated from the LED chip by means of complicated measures in order to keep down the risk of a failure of the LED chip.

Also, the active area of an LED chip can be enlarged in order to achieve a higher total luminous flux. As a result of this, the current density and the heat loss to be dissipated per area could be kept constant even in the case of a high total luminous flux.

An enlarged active area can be achieved, in one instance, by means of an areal arrangement of a plurality of components—LED chips in a housing. However, the space requirement of modules of this type is comparatively high and the packaging density of LED chips and the luminous exitance (luminous flux generated per active area) are, by the same token, comparatively low.

In order to enlarge the active area it is possible, in another instance, to enlarge the lateral area of the LED chip. However, enlarging the area of the LED chip entails an increase in the risk of the LED chip having a fabrication-dictated defect.

Defects of this type may impair the function of the LED chip or even render it totally unusable. By way of example, such defects may lead to a reduction of the luminous efficiency on account of radiationless recombination (e.g. surface recombination) or to a short circuit of the active zone of the LED chip. Fabricating defect-free semiconductor layer sequences provided for the formation of optoelectronic semiconductor chips is very complicated from a present-day standpoint.

SUMMARY OF THE INVENTION

It is an object of the invention to provide an optoelectronic semiconductor chip for which the active area can be enlarged in a simplified manner compared with conventional optoelectronic semiconductor chips.

It is another object of the invention to provide a method for forming a contact structure for an optoelectronic semiconductor chip which facilitates the fabrication of optoelectronic semiconductor chips with an enlarged active area.

This and other objects are attained in accordance with one aspect of the present invention directed to an optoelectronic semiconductor chip that comprises a plurality of semiconductor function regions arranged on a common carrier layer, and a contact structure for making electrical contact with the optoelectronic semiconductor chip. At least one of the semiconductor function regions is a defect region. The contact structure is electrically conductively connected to at least one of the semiconductor function regions, and the contact structure is adapted to be electrically separated, or it is electrically separated, from the defect region.

An optoelectronic semiconductor chip of this type can advantageously be fabricated in the wafer assembly.

As discussed herein, a wafer assembly is to be understood as a semiconductor layer sequence which is arranged on a carrier layer and is provided for the formation of at least a part of the semiconductor function regions. The carrier layer may comprise the growth substrate on which the semiconductor layer sequence has been grown, for example epitaxially, or a layer which is different from the growth substrate of the semiconductor layer sequence and on which the semiconductor layer sequence is arranged in the course of its processing in the wafer assembly. The semiconductor layer sequence can be arranged and/or fixed on the last-mentioned carrier layer—different from the growth substrate—for example by means of an adhesive-bonding connection, a soldering connection or a wafer bonding method.

Also, a defect region is to be understood as a semiconductor function region which does not fulfill a specific measure, for example a predetermined function parameter. This includes in particular a defect region having a lethal defect which, if conductively connected to the contact structure, during operation, would cause a critical malfunction such as the failure of the semiconductor function region having the lethal defect, for instance due to a short circuit of the active zone, or even of the entire semiconductor chip.

In particular, in accordance with an embodiment of the invention, the defect region may be electrically insulated, in particular isolated or separated, from the contact structure before the semiconductor chip is put into operation. When the semiconductor chip is put into operation, the defect region is then advantageously not electrically conductively connected to the contact structure. Consequently, no critical malfunction of the semiconductor chip is caused on account of the defect region, in particular in the case of a lethal defect.

The semiconductor function regions may be formed for radiation generation or for radiation reception for example in accordance with the structure of an LED chip or a photodiode chip. The dimensions of the individual semiconductor function regions preferably correspond to those of conventional chips that are known to operate reliably and/or can be fabricated in high numbers efficiently with high yield.

The function parameters may be for example the emission wavelength (peak or dominant wavelength) of a radiation generated in the semiconductor function region, the luminous flux or the radiation power of the radiation generated, or the efficiency of the semiconductor function region (e.g. internal quantum efficiency or external efficiency).

In the case of a semiconductor function region provided for radiation reception, the wavelength of maximum sensitivity of the semiconductor function region toward incident radiation or the photocurrent may be used as function parameters, by way of example.

Further properties or quantities that are characteristic of optoelectronic semiconductor chips, for instance the forward voltage, may also be used as function parameters.

If the deviation of a function parameter of the semiconductor function region from a predetermined desired value is greater than a previously defined limit value, then this semiconductor function region is classified as a defect region.

The active area of the semiconductor chip is preferably determined by the lateral extent of active zones which are arranged in the semiconductor function regions and are formed for the radiation generation or for the radiation reception of the optoelectronic semiconductor chip.

The lateral dimensions of the semiconductor function regions or of the active zones are expediently chosen in such a way that the probability of finding a defect—in particular a lethal defect—in a semiconductor function region is tolerably low. This probability may vary depending on the material system on which the semiconductor function region is based, and/or the process implementation in the fabrication of the semiconductor layer sequence. A probability of 10%, preferably 5%, particularly preferably 1% or less may be regarded as low in the above sense.

Optoelectronic semiconductor chips of this type may have an active area that is 1 mm$^2$, preferably 10 mm$^2$, particularly preferably 1 cm$^2$ or greater. An active area from including 10 mm$^2$ to including 1 cm$^2$ has proven to be particularly advantageous. The probability of a failure of the optoelectronic semiconductor chip on account of a lethal defect in the semiconductor function regions is advantageously reduced owing to the active area being divided between a plurality of semiconductor function regions and a targeted isolatability or separatability of the defect regions from the contact structure.

A contact structure of the above type can advantageously facilitate the fabrication of an optoelectronic semiconductor chip according to an embodiment of the invention with a comparatively large active area intended for radiation generation or for radiation reception by virtue of the fact that defect regions, in particular those having lethal defects, can be separated or are separated from the contact structure. The risk of a failure or of a restricted function of the semiconductor chip on account of a malfunction in a defect region is thus advantageously reduced.

The semiconductor function regions are preferably fabricated at least in part by means of epitaxy on a common growth substrate and/or formed uniformly.

In one refinement of the invention, the semiconductor function regions or the active zone contain at least one III-V semiconductor material, for instance a material from material systems $In_xGa_yAl_{1-x-y}P$, $In_xGa_yAl_{1-x-y}N$ or $In_xGa_yAl_{1-x-y}As$, in each case where $0 \leq x \leq 1$, $0 \leq y \leq 1$ and $x+y \leq 1$. In this case, $In_xGa_yAl_{1-x-y}P$ is particularly suitable for example for radiation from the infrared through to the yellow spectral region and $In_xGa_yAl_{1-x-y}N$ is particularly suitable for radiation from the green through to the ultraviolet spectral region. III-V semiconductor materials, in particular those mentioned above, may be distinguished by advantageously high internal quantum efficiency.

In a further refinement of the invention, a mirror layer is arranged at least between a part of the semiconductor function regions and the carrier layer. Through reflection of radiation that is generated in the active zone or is incident on the semiconductor chip, a mirror layer of this type can reduce an absorption in the carrier layer or advantageously increase the efficiency of the optoelectronic semiconductor chip. The mirror layer may for example comprise a Bragg mirror and/or contain a metal.

Bragg mirrors may advantageously be fabricated, for example epitaxially, together with the semiconductor layer sequence in the wafer assembly.

A metal-containing mirror layer can be formed over, in particular applied to, or is arranged on the semiconductor layer sequence after the fabrication thereof whilst still in the wafer assembly. The arrangement may be effected by sputtering or vapor deposition. Suitable metals may be for example Au, Al, Ag, Pt or alloys with at least one of said materials.

Au, for example, is distinguished by an advantageously high reflectivity in the red spectral region, while Al and Ag may also have a high reflectivity in the ultraviolet and blue spectral region.

In accordance with a development of the invention, the mirror layer, in particular a metal-containing mirror layer, is applied to a semiconductor layer sequence that is arranged on a first carrier layer, on that side of the semiconductor layer sequence which is remote from the first carrier layer. The first carrier layer can include the growth substrate of the semiconductor layer sequence. After the application of the mirror layer, the assembly comprising first carrier layer and semiconductor layer sequence is arranged on a second carrier layer on the side of the mirror layer. The assembly can be fixed on the second carrier layer for example by means of a solder connection, an adhesive-bonding connection or a wafer bonding method. The first carrier layer of the semiconductor layer sequence can thereupon be stripped away from the semiconductor layer sequence. By way of example, laser-assisted methods, for instance a laser ablation method, mechanical methods, such as grinding, or etching methods are suitable for stripping.

Optoelectronic semiconductor chips fabricated with the growth substrate of the semiconductor layer sequence being stripped away are often also referred to as thin-film chips. Semiconductor chips that are fabricated in this way and are provided for radiation generation may be distinguished, in particular with a metal-containing mirror layer, by an at least approximately co sinusoidal emission characteristic essentially corresponding to a Lambert radiator. Such a thin-film chip may be to a good approximation a Lambert surface radiator and is therefore particularly well suited to application in a headlight.

A thin-film chip may furthermore be distinguished in particular by the following characteristic features:

the semiconductor layer sequence or the semiconductor function regions have a thickness in the region of 20 μm or less, in particular in the region of 10 μm, and/or the semiconductor layer sequence or the semiconductor function regions contain, in the case of a thin-film chip provided for radiation generation, at least one semiconductor layer with at least one area that has an intermingling structure that ideally leads to an approximately ergodic distribution of the light in the—preferably epitaxially fabricated—semiconductor layer sequence, i.e. it has an as far as possible ergodically stochastic scattering behavior.

A basic principle of a thin-film LED chip is described for example in I. Schnitzer et al., Appl. Phys. Lett. 63 (16), Oct. 18, 1993, 2174-2176, the disclosure content of which is hereby explicitly incorporated by reference in this respect.

In a further refinement of the invention, the semiconductor function regions of the semiconductor chip may be operated in a parallel connection.

Another aspect of the present invention is directed to method for forming a contact structure for making electrical contact with an optoelectronic semiconductor chip having a plurality of semiconductor function regions arranged on a common carrier layer. Firstly, a semiconductor layer sequence is provided which is arranged on a carrier layer, after which the semiconductor layer sequence is patterned in such a way that a plurality of semiconductor function regions are produced. Afterward, at least some of the plurality of semiconductor function regions are tested with regard to their function or a predetermined function parameter, and defect regions from among the semiconductor function regions are identified. A contact structure is formed, which is arranged on the side of the semiconductor function regions which is opposite of the carrier layer, for making contact with the semiconductor function regions in such a way that the contact structure is electrically insulated from the defect regions.

A method of this type facilitates making contact with the semiconductor function regions that are defect-free, functional or satisfy a predetermined function parameter in the wafer assembly. The function parameter can be one of the function parameters cited further above.

In particular, in the case of the method, as early as before the semiconductor chip is put into operation, that is to say before electrical contact is made with the semiconductor chip by means of the contact structure, or before current is impressed into the semiconductor chip by means of the contact structure. The contact structure may already be formed in such a way that a defect region is electrically insulated, in particular isolated, from the contact structure. For this purpose, the contact structure can be formed correspondingly after the testing of the semiconductor function regions with regard to their function or a predetermined function parameter.

In particular, the method according to the invention may be used for forming a contact structure for an optoelectronic semiconductor chip according to the invention of the type mentioned above. Features concerning the semiconductor chip that are mentioned above and below may thus also relate to the method according to the invention, and vice versa.

In one refinement, the patterning of the semiconductor layer sequence into a plurality of semiconductor function regions is effected from that side of the semiconductor layer sequence which is remote from the carrier layer. Patterning of this type may be effected for example by means of masking and etching processes, for instance photolithographic methods in combination with wet- or dry-chemical etching.

In a further refinement, the semiconductor function regions of the semiconductor chip are spaced apart from one another. In particular, the semiconductor function regions may be spatially separated from one another by interspaces. During the patterning of the semiconductor layer sequence into a plurality of semiconductor function regions, the interspaces can be formed in such a way that they reach as far as onto the carrier layer or into the carrier layer. The semiconductor function regions can be free of an—in particular direct—connection via an element of the semiconductor layer sequence, such as for instance an individual semiconductor layer which is common to a plurality of semiconductor function regions. The semiconductor function regions can be completely spatially separated from one another by the interspaces.

During the testing of the semiconductor function regions with regard to their function or a predetermined function parameter, at least those semiconductor function regions are identified as defect regions which have a lethal defect and are not intended to be conductively connected to the contact structure for the operation of the optoelectronic semiconductor chip.

After the testing of the semiconductor function regions, the contact structure is arranged on the side of the semiconductor function regions which is opposite of the carrier layer and said contact structure can be conductively connected to the semiconductor function regions that have been classified as functional with regard to the function parameter. The contact structure can be formed in such a way that all defect regions having lethal defects, in particular defects that short circuit the active zone, are electrically separated or insulated from the contact structure.

In a refinement of the invention, a contact material is arranged in a manner patterned in accordance with the contact structure on the side of the semiconductor function regions which is opposite of the carrier layer, so that the defect regions are insulated from the contact structure. This may be achieved for example by means of a lift-off process using a suitable mask structure, for instance a photoresist layer, which has been suitably exposed and developed. The mask structure prevents, for example by covering or shading the relevant regions, a conductive connection of the contact material to the defect region.

In a further refinement, the contact material is patterned in accordance with the contact structure after arrangement on the side of the semiconductor function regions which is opposite of the carrier layer. In one development, the contact material is arranged in a manner patterned in accordance with a coarse contact structure on the side of the semiconductor function regions which is opposite of the carrier layer, and the defect regions are isolated from the contact structure in a targeted manner after the arrangement of the contact structure, for instance by means of a laser-assisted method.

In accordance with another development of the invention, an insulation structure is arranged between the carrier layer and the contact structure. The insulation structure, for example in the form of an insulation material, can be arranged in the region of the interspaces between individual semiconductor function regions. An insulation structure of this type can electrically insulate the contact structure from a counter-contact structure arranged on the side of the carrier layer opposite of the semiconductor function regions. The counter-contact structure is arranged for example in the form of a counter-contact layer on the carrier layer.

In a further development of the invention, the semiconductor function regions are connected or can be connected in parallel at least in part via the contact structure and the counter-contact structure during operation of the semiconductor chip.

DETAILED DESCRIPTION OF THE DRAWINGS

Elements that are of the same type and act identically are provided with the same reference symbols in the figures.

FIG. 1 shows an exemplary embodiment of a method according to the invention for forming a contact structure for making contact with an optoelectronic semiconductor chip on the basis of intermediate steps and different views illustrated schematically in FIGS. 1A to 1G.

Figure 1A:
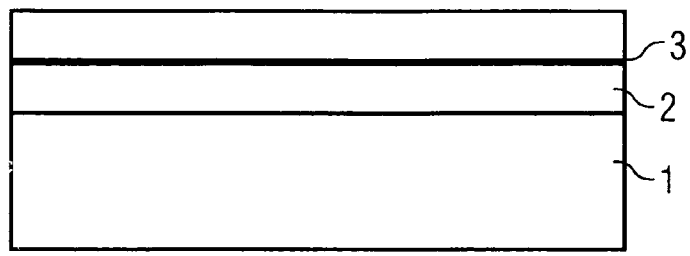
FIG. 1 shows a schematic illustration of an exemplary embodiment of a method sequence according to the invention on the basis of intermediate steps shown in different views in FIGS. 1A to 1G.
Figure 1B:
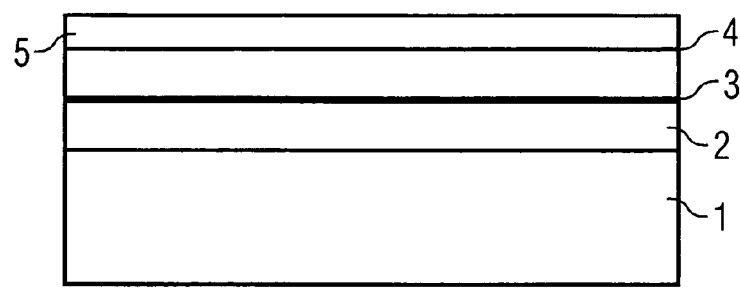
Figure 1C:
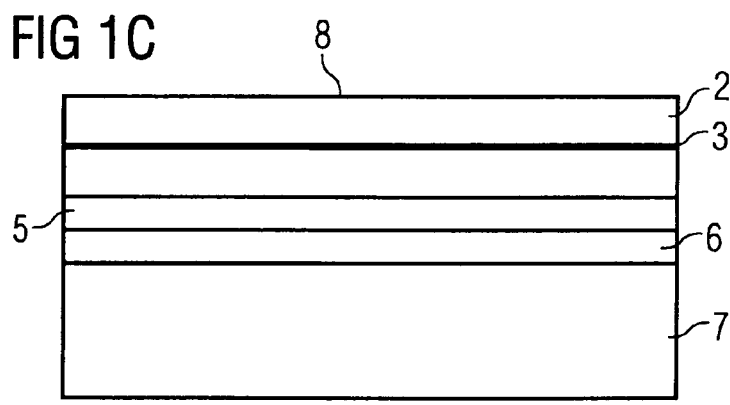

Firstly, as illustrated in FIG. 1A on the basis of a schematic sectional view, provision is made of a semiconductor layer sequence 2—arranged on a first carrier layer 1 in the wafer assembly—with an active zone 3 intended for radiation generation or for radiation reception.

The semiconductor layer sequence, in particular the active zone, is preferably based on a III-V semiconductor material, for example $In_xGa_yAl_{1-x-y}P$, and is formed for LED chips in this exemplary embodiment. The first carrier layer 1 is for example the growth substrate of the semiconductor layer sequence and is made, for instance, of GaAs.

In accordance with a refinement of the invention, the active zone 3 comprises a pn junction, a single or multiple heterostructure, for instance a double heterostructure. Heterostructures, in particular double heterostructures, are distinguished by an advantageously high quantum efficiency.

Afterward, a mirror layer 5 is applied to or formed over, preferably over the whole area, a first main area 4 of the semiconductor layer sequence 2, said first main area being remote from the first carrier layer 1. The mirror layer contains for example a metal, such as Au, and may be applied to the semiconductor layer sequence by sputtering or vapor deposition. This is illustrated schematically in FIG. 1B. Au is distinguished by a high reflectivity in the red spectral region and by good electrical contact properties with respect to $In_xGa_yAl_{1-x-y}P$.

The wafer assembly with mirror layer 5, semiconductor layer sequence 2 and first carrier layer 1 is thereupon arranged and/or fixed on a second carrier layer 7 on the side of the first main area 4 of the semiconductor layer sequence, preferably by means of a connecting layer 6. The connecting layer comprises, for example, a solder layer or a layer formed in a wafer bonding method.

The second carrier layer 7 contains GaAs, for example, and may be doped in order to increase its conductivity in accordance with one development of the invention. The second carrier layer can be doped in accordance with the conduction type of that region of the semiconductor layer sequence which is closest to the carrier layer.

The first carrier layer 1 may subsequently be stripped away from the semiconductor layer sequence for example by means of grinding, etching or a laser ablation method. The structure that emerges from this is illustrated schematically in FIG. 1C.

In a subsequent method step, the semiconductor layer sequence 2 is patterned from the second main area 8 in such a way that semiconductor function regions 10 that are spatially separated, in particular completely separated, from one another by interspaces 9 are produced. The interspaces 9 preferably extend right into the second carrier layer 7. The patterning may be effected for example by means of photolithographic methods in combination with etching processes. For this purpose, a photoresist layer is applied on the side of the second main area 8 of the semiconductor layer sequence 2 and patterned in accordance with the structure of the desired interspaces by means of patterned exposure and subsequent development. This mask structure is subsequently transferred into the semiconductor layer sequence and, if appropriate, into the second carrier layer 7, for instance by means of wet- or dry-chemical etching. The photoresist that has still remained can subsequently be removed.

Figure 1D:
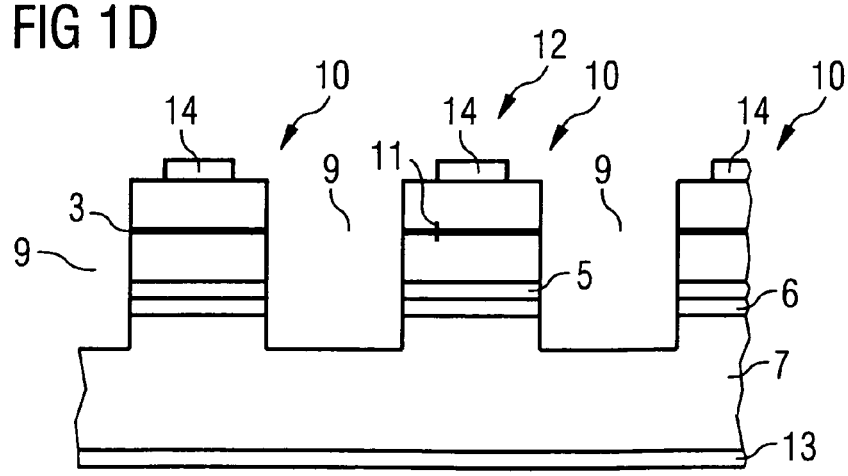

The wafer assembly after this patterning is illustrated schematically on the basis of a sectional view in FIG. 1D. The semiconductor function regions 10 of identical type each have the active zone 3 and the mirror layer 5 arranged on the second carrier layer 7 by means of the connecting layer 6, said second carrier layer preferably mechanically stabilizing the semiconductor function regions.

One of the semiconductor function regions 10 shown has a lethal defect 11, for example stemming from the epitaxy process, which would short circuit the active zone 3 of this defect region 12 during operation.

The lateral dimensions of the semiconductor function regions can be chosen in such a way that the probability of a defect of this type occurring in the semiconductor function region is relatively low. In the case of conventional semiconductor layer sequences based on $In_xGa_yAl_{1-x-y}P$, typically approximately 10 lethal defects occur per square centimeter of the lateral extent of the semiconductor layer sequence, so that the semiconductor function regions expediently have a correspondingly small lateral extent. For purposes of illustration, it is assumed that the layer sequence has an area of 1 square centimeter and 10 lethal defects. Subdividing this sequence into, in plan view, square shaped semiconductor function regions having an edge length of 300 µm results in approximately 1111 separate function regions, if the lateral extent of the interspaces between two adjacent regions is neglected for a first approximation. The probability of finding one of the 10 lethal defects in a single region is then $10/1111$, i.e. about 0.9%. This probability of finding a defect in one of the regions may, in general, be lowered by reducing the function region area and accordingly increasing the number of function regions into which a semiconductor layer sequence of a given area is subdivided.

By way of example, the semiconductor function regions may be embodied as semiconductor function regions that are essentially rectangular or square in plan view with an edge length of 300 µm, preferably 200 µm or less. The interspaces may have a lateral extent of 20 µm, preferably 10 µm, or less in the sectional view.

The semiconductor function regions are subsequently tested with regard to their function in accordance with a predetermined function parameter and/or with regard to lethal defects.

For this purpose, in one refinement of the invention, a counter-contact layer 13 is arranged on that side of the second carrier layer 7 which is remote from the semiconductor function regions. The counter-contact layer can be applied to the carrier layer essentially over the whole area. Contact points 14 are provided on the side of the semiconductor function regions. Via the contact points 14 and the counter-contact layer 13, the semiconductor function regions can be tested with regard to their function or function parameters, for example in a wafer prober. In this case, electrical contact is made with the semiconductor function regions via the contact points 14 and the counter-contact layer 13, which is conductively connected to the active zone via the second carrier layer 7, the connecting layer 6 and the mirror layer 5.

In a departure from the electrical test method cited above, the function of the semiconductor function regions can also be tested optically in accordance with a further refinement of the invention. For this purpose, by way of example, a laser can excite a semiconductor function region to photoluminescence and the intensity of the re-emitted luminescence radiation can be evaluated, on the basis of which the defect regions can be determined.

Furthermore, for test purposes, it is also possible to observe the absorption of a suitable laser beam in the semiconductor function region in reflection or else, if appropriate, in transmission given a mirror layer that is absent or formed in correspondingly selective or thin fashion. At least the lethal defect regions can be identified by this means.

These optical test methods can reduce the fabrication outlay because contact points are not needed.

During or after the definition or identification of the defect regions 12, in particular those having lethal defects, in a wafer assembly patterned in accordance with FIG. 1D, it is possible to store the position of the defect regions in the wafer assembly in a wafer map in order for the position of the defect regions to be available in later method steps.

Before or after the test procedure, an insulation structure can be arranged in the interspaces 9 between the semiconductor function regions 10.

The insulation structure can include a filling material 16 (FIG. 1E) and also, a passivation layer 15, containing or comprising for example a silicon nitride, silicon oxide or silicon oxinitride (such as $SiN_x$, $SiO_x$ or SiON; x may assume for example values, preferably integral values in the range $1 \leq x \leq 4$), which increases the protection of the semiconductor function region and/or is formed in electrically insulating fashion.

The passivation layer is preferably transmissive to radiation, formed around the semiconductor function regions 10 at least in part and/or is arranged in a manner directly adjoining the latter. The passivation layer may be applied for example essentially over the whole area, such as by means of sputtering, CVD (Chemical Vapor Deposition) or PECVD (Plasma Enhanced CVD) methods, and subsequently be patterned in such a way that electrical contact can be made with the semiconductor function regions, or be applied such that it is already correspondingly patterned, it being possible, if appropriate, for the patterned application of the passivation layer likewise to use the above methods possibly in combination with a suitable mask.

The filling material 16, for example containing BCB (benzocyclobutene), is preferably formed such that it is electrically insulating and/or at least partly fills the interspaces 9 in the vertical direction. The filling material can be plastically shapeable at least during application and/or can be applied or introduced by spincoating, for instance. Furthermore, the filling material preferably cures after application or introduction or is cured after application or introduction, preferably at temperatures that are not harmful for the semiconductor function regions.

In one refinement of the invention, the filling material 16 fills the interspaces 9 in such a way as to produce an essentially planar surface on the side of the surface 17 of the structure illustrated in FIG. 1E. The filling material 16 is at least arranged in such a way as to facilitate the subsequent application of a contact structure on the side of the surface 17 on account of the relief of the structure from FIG. 1E that is flattened by means of the filling material. A flattening of the relief can reduce the mechanical loading of a subsequently applied contact material and thus also the risk of a failure of the semiconductor chip or of individual semiconductor function regions.

In a departure from the illustration in FIGS. 1D and 1E, the boundaries of the interspaces 9 may also have a form that deviates from the essentially rectangular cross section illustrated. By way of example, the lateral extent of the interspace may taper in the direction of the carrier layer in sectional view, for instance in a trapezoidal cross section. The application of the passivation layer 15, for example, may thereby be facilitated. The semiconductor function regions may be arranged on the second carrier layer in correspondingly mesa-like fashion—preferably with a, for example trapezoidal, cross section complementary to the cross section of the interspaces.

On the side of the surface 17 of the structure shown in FIG. 1E, a contact structure 18 is subsequently arranged in such a way that the defect region 12 is electrically separated from the contact structure 18, while the defect-free semiconductor function region 10 is electrically conductively connected to the contact structure via the contact point 14. The position of the defect regions can be gathered from the wafer map.

The contact structure 18 is fabricated for example by the application of an electrically conductive contact material, containing for example a metal such as Au, Al, Ag, Pt, Ni, Ti, Pd or alloys with at least one of said materials, to the insulation structure. This may be effected for example by means of a conventional lift-off process with a suitably formed mask.

AuZn, in particular, is suitable for forming an advantageous contact with respect to p-conducting semiconductor materials from the material system $In_xGa_yAl_{1-x-y}P$, for example, and AuGe, in particular, is suitable with respect to n-conducting semiconductor materials from said material system.

The contact material may either be applied in a manner already patterned on the side of the surface 17, so that the defect region 12 is electrically insulated from the contact structure 18, or be correspondingly patterned after application.

In the former case, the mask material (e.g. a photoresist) used during the lift-off process is patterned in such a way as to prevent contact from being made with the defect region 12 by means of the subsequently applied contact material. It is possible to prevent contact from being made with the defect region for instance by shading or covering the relevant regions by means of the mask material during the application of the contact material. For this purpose, a photoresist, for example a negative photoresist, as mask material may firstly be exposed in such a way that contact is made with essentially all semiconductor function regions, including possible defect regions. Afterward, the photoresist may be post-exposed in a targeted manner in accordance with the arrangement of the defect regions, for example by means of a scanning electron microscope (E-beam exposure). In the case of a negative photoresist, photoresist material remains after development in the exposed and post-exposed regions. The post-exposed regions advantageously prevent a conductive connection of the defect regions to the contact structure by means of the mask that is consequently formed after development.

In the latter case, the contact material, for example initially in a coarse structure which is conductively connected essentially to all semiconductor function regions, defective and also defect-free regions, may be applied to the surface 17 and be patterned after application, for example by means of a laser-assisted method.

This is illustrated on the basis of a schematic sectional view in FIG. 1F. The contact structure 18 has been severed by means of a laser in such a way that an insulating gap 19 insulates the defect region 12 from the contact material. In this case, the contact structure can be severed in the region above the defect region or the insulation structure.

This is shown in FIG. 1G on the basis of a plan view of part of the wafer assembly. It can be discerned here that the functional semiconductor function regions are conductively connected via the contact points 14 to the contact structure 18, which has a main line 181 illustrated in FIG. 1G and leads 182 branching from the main line to the individual semiconductor function regions. FIG. 1F corresponds to a sectional view along the line A-A from FIG. 1G.

A contact structure of this type may be formed for all patterned semiconductor function regions in the wafer assembly, the concrete embodiment of which contact structure may also deviate from that shown in FIG. 1G. Depending on the desired active area of the optoelectronic semiconductor chip, the wafer assembly may then be singulated into partial wafers in such a way as to produce one or a plurality of optoelectronic semiconductor chips with an advantageously large, scaleable active area, the risk of a failure of the semiconductor chips during operation on account of defects in one of the semiconductor function regions at least being considerably reduced.

The singulation may be effected for example by means of sawing, laser separation or water jet cutting.

The individual semiconductor function regions of the optoelectronic semiconductor chip fabricated in this way may be operated in a parallel connection via the counter-contact layer 13 and the contact structure 18. The risk of a total failure of the semiconductor chip due to a short-circuiting lethal defect is at least greatly reduced by virtue of the targeted formation of the contact structure.

With optoelectronic semiconductor chips of this type, in the material system $In_xGa_yAl_{1-x-y}P$, it is possible to achieve a total luminous flux of approximately 1000 lumen for an active area of approximately 4 mm×4 mm. Given a defect probability for a lethal defect in a 200 μm×200 μm lateral area of the semiconductor layer sequence of 1%, for example, the probability of a lethal defect occurring would be greater than 98% in the case of a contiguous active area—an area not being subdivided into individual semiconductor function regions. Dividing the active area into semiconductor function regions advantageously reduces the probability of failure of the semiconductor chip and facilitates the fabrication of optoelectronic semiconductor chips with an active area that can be enlarged in a simplified manner.

Figure 2A:
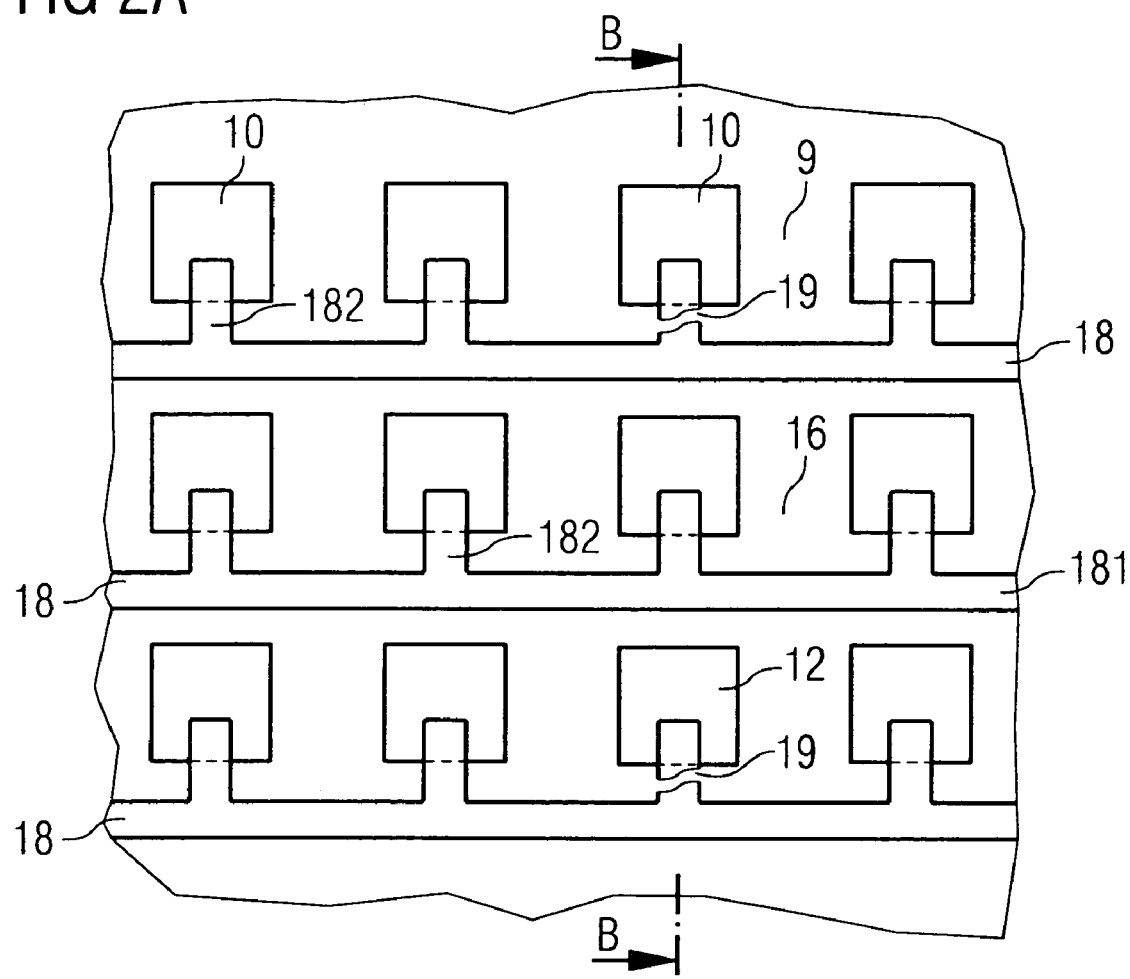
FIG. 2 shows a schematic illustration of an exemplary embodiment of an optoelectronic semiconductor chip according to the invention on the basis of a schematic plan view from above in FIG. 2A and a schematic sectional view in FIG. 2B.
Figure 2B:
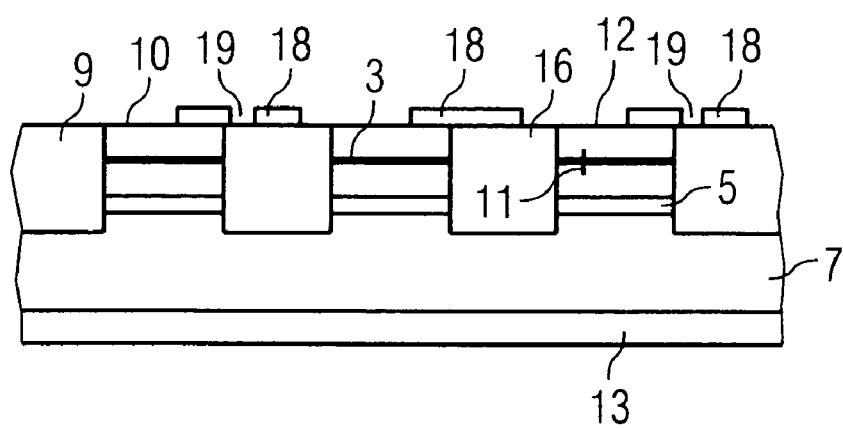

FIG. 2 shows a schematic illustration of part of an exemplary embodiment of an optoelectronic semiconductor chip according to the invention on the basis of a schematic plan view from above in FIG. 2B and a schematic sectional view in FIG. 2B along the line B-B in FIG. 2A.

By way of example, the semiconductor chip may be fabricated in a similar manner to the method illustrated in FIG. 1.

The semiconductor function regions 10 are arranged in a grid essentially corresponding to a square lattice on the carrier layer 7. A filling material 16, for example BCB, is arranged in the contiguous network of interspaces 9 between the individual semiconductor function regions, and planarizes the relief of the structure in FIG. 2B in such a way as to facilitate the application of the contact structure 18. A mirror layer 5 is arranged between the semiconductor function regions and the carrier layer 7. In contrast to the structure shown in FIG. 1G, in this exemplary embodiment the contact structure is arranged in rowlike fashion in the interspaces 9 in the horizontal direction in FIG. 2A. In a departure from this illustration, however, a contact structure or contact material may also be provided in the vertical interspaces, thus giving rise to an essentially cross-lattice type arrangement of the main lines 181. A semiconductor function region may also be conductively connected to a plurality of leads 182—for example a lead proceeding from a horizontally running main line and a lead proceeding from a vertically running main line.

The defect region 12 is electrically separated from the contact structure 18 by an insulating gap 19.

In this exemplary embodiment, an in principle functional, defect-free semiconductor function region is also separated from the contact structure 18 by means of an insulating gap 19. The fact that, in accordance with a preferred refinement of the invention, the number of semiconductor function regions separated from the contact structure is greater than the number of defect regions present means that it is possible to achieve a narrower distribution of the function parameters of the optoelectronic semiconductor chip during fabrication.

More specifically, during growth of a semiconductor layer sequence, lethal defects may arise in the semiconductor layer sequence. However, the number of defects may be greater in a first layer sequence than in a second, separately grown layer sequence having the same structure as the first sequence. Hence there are more defect regions after structuring the first sequence than after structuring the second sequence into the same semiconductor function regions, respectively. Semiconductor chips fabricated from the first sequence, said chips having a given number of semiconductor function regions, including defect and non-defect regions, on average may comprise more defect regions than chips fabricated from the second sequence, having the same number of semiconductor function regions. This results in different function parameters, for example the luminance of radiation emitted, of chips fabricated from layer sequences of the same kind, which were grown separately. To narrow the distribution of the function parameter, an average might be taken on how many defects usually occur in a given area of layer sequences of the same kind, and then, after the function regions have been tested for defects, that a number of function regions preferably greater than such average number of defect regions is separated from the contact structure, regardless of whether the separated regions are defect regions or not. However, at least all of the identified defect regions should be separated from the contact structure.

In a preferred refinement of the invention, a fixed percentage, preferably 5%, particularly preferably 3% or less, of the semiconductor function regions of the optoelectronic semiconductor chip is isolated from the contact structure. Said percentage is expediently greater than the typical relative frequency of defect regions. Thus, by way of example, from 100 semiconductor function regions, 5 might be isolated from the contact structure.

The further functional semiconductor function regions are connected to the contact structure 18 via leads 182. Contact is made with the semiconductor chip via the counter-contact layer 13 and the contact structure, the defect region 12 being electrically insulated from the contact structure during operation of the semiconductor chip.

In a radiation-emitting or -receiving semiconductor component, an optoelectronic semiconductor chip according to the invention may be arranged in a housing body. The semiconductor chip is preferably arranged in a recess in the housing body. The walls of the recess may be provided with a reflection-increasing material, for example containing a metal.

The semiconductor chip may furthermore be surrounded or reshaped at least partially by a protective encapsulation material, for example a reaction resin such as an acrylic or epoxy resin, containing a silicone resin or a silicone, which can be arranged in the recess. The contact structure and the counter-contact layer are preferably electrically conductively connected to external connections via which contact can be made with the semiconductor chip from the exterior of the housing. Furthermore, a semiconductor component of this type can be of surface mountable design (SMD: Surface Mountable Device).

If the semiconductor component is provided for generating mixed-color, in particular white, light, then for example a luminescence conversion material is arranged downstream of the semiconductor chip and partially converts the radiation generated by the semiconductor chip into a preferably longer-wave radiation. Mixed-color light can then be produced from the mixture of these wavelengths.

For generating white light in this way, the semiconductor chip can be based on $In_xGa_yAl_{1-x-y}N$ and generates blue radiation, for example, which is mixed with a re-emitted yellow radiation of a, for example phosphorus containing, converter material in the encapsulation to form white light. The mirror layer 5 contains Ag, for example, and the growth substrate or the carrier layer contains SiC, GaN or sapphire.

Mixed-color, in particular white, light may furthermore be generated by suitable mixing of light with wavelengths corresponding to the primary colors red, green and blue. Preferably, at least one of the primary colors, particularly preferably all three, are generated by means of an optoelectronic semiconductor chip according to the invention, which emits radiation having a corresponding wavelength during operation.

It should be noted that the invention does not just relate to semiconductor chips with a metallic mirror layer. Rather, the invention also encompasses semiconductor chips without a mirror layer or with a Bragg mirror. The arrangement on a second carrier layer can consequently be dispensed with in a method corresponding to FIG. 1.

Furthermore, in the case of the invention, a series or series-parallel connection of the semiconductor function regions of the semiconductor chip may also be achieved, if appropriate, by means of a correspondingly modified method. The counter-contact layer may be correspondingly patterned for this purpose, if appropriate.

Moreover, it should be noted that, of course, the invention does not just relate to optoelectronic semiconductor chips for the visible spectral region. Rather, the invention may also be used in the case of optoelectronic semiconductor chips for the non-visible, in particular the ultraviolet or the infrared, spectral region. On account of the targeted formation of the contact structure for the insulation of defect regions, the active area may also be enlarged in a simplified manner in the case of semiconductor chips of this type. In particular the radiation power generated may be increased in the case of radiation-emitting semiconductor chips.

The scope of protection of the invention is not limited to the examples given herein above. The invention is embodied in each novel characteristic and each combination of characteristics, which particularly includes every combination of any features which are stated in the claims, even if this feature or this combination of features is not explicitly stated in the claims or in the examples.

I claim:

1. An optoelectronic semiconductor chip, comprising:
    a semiconductor layer sequence patterned to form a plurality of semiconductor function regions, said semiconductor function regions each comprising at least one inorganic semiconductor material and being separated from one another by interspaces and being arranged on a common carrier layer, at least one of the semiconductor function regions being a defect region, wherein a metallic mirror layer is arranged between the semiconductor function regions and the common carrier layer;
    a contact structure for making electrical contact with the optoelectronic semiconductor chip; and
    a counter-contact layer arranged on a side of the common carrier layer opposite to the semiconductor function regions, such that the counter-contact layer is a common counter-contact layer of all of the semiconductor function regions,
    wherein the contact structure is electrically conductively connected to at least one of the semiconductor function regions;
    wherein the contact structure is adapted to be electrically separated, or is electrically separated, from the defect region;
    wherein all of the semiconductor function regions connected to the contact structure are connected in parallel via the contact structure and the counter-contact layer;
    wherein the interspaces are at least partially filled with a filling material; and
    wherein the contact structure is arranged on the filling material.

2. The optoelectronic semiconductor chip as claimed in claim 1, wherein the carrier layer comprises a growth substrate of a semiconductor layer sequence and the semiconductor layer sequence is provided for the formation of the semiconductor function regions.

3. The optoelectronic semiconductor chip as claimed in claim 1, wherein the carrier layer is different from a growth substrate of a semiconductor layer sequence provided for the formation of the semiconductor function regions.

4. The optoelectronic semiconductor chip as claimed in claim 1, wherein the semiconductor function regions comprise an active zone provided for radiation generation or for radiation reception.

5. The optoelectronic semiconductor chip as claimed in claim 4, wherein the active area of the semiconductor chip is 1 mm$^2$ or greater.

6. The optoelectronic semiconductor chip as claimed in claim 1, wherein an insulation structure is arranged between the carrier layer and the contact structure and said insulation structure in interspaces between the semiconductor function regions.

7. The optoelectronic semiconductor chip as claimed in claim 1, wherein the semiconductor chip contains a III-V semiconductor material, such as $In_xGa_yAl_{1-x-y}P$, $In_xGa_yAl_{1-x-y}N$ or $In_xGa_yAl_{1-x-y}As$, in each case where $0 \leq x \leq 1$, $0 \leq y \leq 1$ and $x+y \leq 1$.

8. The optoelectronic semiconductor chip as claimed in claim 1, wherein the semiconductor chip is fabricated in the wafer assembly.

9. The optoelectronic semiconductor chip as claimed in claim 1, wherein the optoelectronic semiconductor chip is formed as an LED chip.

10. The optoelectronic semiconductor chip as claimed in claim 1, wherein the defect region is electrically separated from the contact structure by an insulation gap.

11. The optoelectronic semiconductor chip as claimed in claim 1, wherein the common carrier layer is doped to provide conductivity between the counter-contact layer and all of the semiconductor function regions.

12. The optoelectronic semiconductor chip as claimed in claim 1, wherein the filling material is arranged between the contact structure and the counter-contact layer.

13. The optoelectronic semiconductor chip as claimed in claim 1, wherein the filling material provides an essentially planar surface of the semiconductor layer sequence on a side of the semiconductor layer that faces the contact structure.

14. The optoelectronic semiconductor chip as claimed in claim 1, wherein the semiconductor chip is an LED chip, and wherein the counter-contact layer and all the semiconductor function regions arranged on the common carrier layer, connected to the contact structure and connected in parallel by the contact structure are operated simultaneously.

* * * * *